(12) United States Patent
Auranen

(10) Patent No.: US 7,233,629 B2
(45) Date of Patent: Jun. 19, 2007

(54) ADJUSTING A RECEIVER

(75) Inventor: Tommi Auranen, Turku (FI)

(73) Assignee: Nokia Corporation, Espoo (FI)

( * ) Notice: Subject to any disclaimer, the term of this patent is extended or adjusted under 35 U.S.C. 154(b) by 618 days.

(21) Appl. No.: 10/184,110

(22) Filed: Jun. 28, 2002

(65) Prior Publication Data

US 2003/0012305 A1 Jan. 16, 2003

(30) Foreign Application Priority Data

Jun. 29, 2001 (FI) .................................. 20011425

(51) Int. Cl.
*H03K 9/00* (2006.01)
(52) U.S. Cl. ...................................... 375/316; 455/326
(58) Field of Classification Search ................ 375/298, 375/316, 285, 322; 455/296, 324, 326, 255
See application file for complete search history.

(56) References Cited

U.S. PATENT DOCUMENTS

| | | | | |
|---|---|---|---|---|
| 5,812,927 A | * | 9/1998 | Ben-Efraim et al. | 725/70 |
| 6,009,317 A | * | 12/1999 | Wynn | 455/296 |
| 6,208,698 B1 | * | 3/2001 | Marchesani et al. | 375/298 |
| 6,377,620 B1 | * | 4/2002 | Ozluturk et al. | 375/235 |
| 6,483,388 B2 | * | 11/2002 | Khan | 331/18 |
| 6,490,326 B1 | * | 12/2002 | Bastani et al. | 375/317 |
| 6,725,024 B1 | * | 4/2004 | Lindoff et al. | 455/255 |

FOREIGN PATENT DOCUMENTS

| | | |
|---|---|---|
| EP | 1009101 A2 | 11/1999 |
| EP | 1130866 A1 | 2/2000 |

OTHER PUBLICATIONS

Search Report dated Apr. 10, 2002.

* cited by examiner

*Primary Examiner*—Khanh Tran
(74) *Attorney, Agent, or Firm*—Banner & Witcoff, Ltd.

(57) ABSTRACT

The invention relates to a method for adjusting IQ-imbalance of a direct conversion receiver (200). In the method a radio frequency training signal is locally generating and conveyed to an in-phase branch and a quadrature-phase branch of the receiver (200). The method comprises mixing, in the analogue domain, the radio frequency training signal of the in-phase branch with a first mixing signal to form a baseband in-phase component (I) of the training signal and mixing, in the analogue domain, the radio frequency training signal of the quadrature-phase branch with a second mixing signal to form a phase shifted component (Q) of the training signal. The baseband in-phase component (I) and phase shifted component (Q) are analogue-to-digital converted to form a digital baseband in-phase component and a digital baseband phase shifted component of the training signal. In the method the digital baseband in-phase and phase shifted components of the training signal are analyzed, in a digital demodulator (210), so as to detect the IQ-imbalance of the direct conversion receiver (200). The IQ-imbalance is corrected, based on the analysis, in the analogue domain.

39 Claims, 6 Drawing Sheets

ADJUSTING A RECEIVER

FIELD OF THE INVENTION

The invention relates to adjusting IQ-imbalance (In-phase and Quadrature) of a direct conversion receiver.

BACKGROUND OF THE INVENTION

Digital broadcasting systems, such as digital television systems, are under development, and it is intended that, eventually, they will replace analogue broadcasting systems. This is, among other things, because of their ability to provide new types of services and better quality of service capabilities compared to the analogue broadcasting systems.

One of the digital broadcasting systems currently under standardisation by the European Telecommunications Standards Institute (ETSI) is the Digital Video Broadcasting (DVB) system. In the DVB system digital video is broadcast using satellite, cable and/or terrestrial infrastructures.

The DVB system using terrestrial infrastructure is defined as the DVB-T (DVB-Terrestrial) system. In DVB-T transmission, digital data is modulated onto a radio frequency (RF) signal. The modulation method used is COFDM (Coded Orthogonal Frequency Division Multiplex) modulation. The modulated DVB-T signal is transmitted from a DVB-T transmitter. The transmission occurs over a DVB-T radio channel. The transmitted DVB-T signal is received at a DVB-T receiver. The DVB-T receiver demodulates the received DVB-T signal in order to regenerate the digital data. The digital data may contain, for example, an MPEG-2 (Moving Picture Experts Group) coded video stream.

With terrestrial digital video broadcasting it is possible to achieve a good quality data transfer even if the DVB-T receiver is mobile.

Wireless mobile communication devices are expected to be lightweight and small-sized. That is why the use of a direct conversion architecture in the DVB-T receiver is in many cases more desirable than, for example, the use of a superheterodyne architecture.

In a direct conversion receiver, a radio frequency analogue DVB-T signal, transmitted from a DVB-T transmitter and received at a DVB-T receiver, is converted directly from the radio frequency band to baseband I- and Q-signal components in the DVB-T receiver, in which "I" refers to an in-phase signal component of the DVB-T signal and "Q" refers to a quadrature-phase signal component of the DVB-T signal. In practice, the conversion is performed by splitting the received radio frequency DVB-T signal into two substantially identical signals, mixing one of the signals with a local oscillator signal to form the baseband I-signal component and mixing the other of the signals with a phase shifted local oscillator signal to form the baseband Q-signal component. The phase shifting of the local oscillator signal is performed in a phase shifter the amount of the phase shift being 90 degrees. The phase difference between the signals of an I-branch along which the I-signal component travels in the DVB-T receiver and a Q-branch along which the Q-signal component travels in the DVB-T receiver is thus exactly 90 degrees in an ideal case.

The COFDM modulation method that is used in the DVB-T system is a multicarrier modulation method. This means that, in the DVB-T transmitter, digital data to be transmitted is split into several components which are transmitted over separate carrier signals. In one of the operational modes of the DVB-T system, for example, a DVB-T channel (the bandwidth of which is 8 MHz) contains 6816 carriers (also referred to as "subcarriers"). The carriers themselves are modulated using different level QAM (Quadrature Amplitude Modulation) constellations.

FIG. 1 shows a constellation diagram showing 64-QAM constellation points. The horizontal axis, that is the I-axis, indicates the amplitude of the I-signal component of the DVB-T signal and the vertical axis, that is the Q-axis, indicates the amplitude of the Q-signal component of the DVB-T signal. In FIG. 1, the units of the I-axis and the Q-axis are arbitrary units. The I-axis and the Q-axis define an IQ-plane. Each constellation point in the IQ-plane corresponds to a transmitted bit sequence. The constellation point (I=3, Q=5), for example, corresponds to a transmitted bit sequence 001011.

It is important that the phase difference between the signals of the I-branch and the Q-branch is 90 degrees because if it differs from 90 degrees, that is there exists IQ-imbalance (more particularly IQ-phase imbalance), the probability that the transmitted bits are not detected correctly in the DVB-T receiver rises. The more complex QAM modulation is used the more sensitive the bit detection is to the IQ-imbalance.

The DVB-T system is a broadband system using a large variety of frequencies. If, for example, the UHF (UltraHigh Frequency) band is used with a channel width of 8 MHz, the used frequency band extends from 470 MHz to 862 MHz. It is difficult and expensive to manufacture a phase shifter that would perform a stable 90 degrees phase difference for the I- and Q-branches in the whole region of the used frequency band, especially taking into consideration the small size requirement of the wireless mobile communication devices.

SUMMARY OF THE INVENTION

According to a first aspect of the invention there is provided a method for adjusting IQ-imbalance of a direct conversion receiver the method comprising:

locally generating a radio frequency training signal;

conveying in the analogue domain the radio frequency training signal to an in-phase branch of the direct conversion receiver and to a quadrature-phase branch of the direct conversion receiver;

mixing, in the analogue domain, the radio frequency training signal of the in-phase branch with a first mixing signal to form a baseband in-phase component of the training signal and mixing, in the analogue domain, the radio frequency training signal of the quadrature-phase branch with a second mixing signal to form a phase shifted component of the training signal;

analogue-to-digital converting the baseband in-phase component of the training signal and the baseband phase shifted component of the training signal to form a digital baseband in-phase component of the training signal and a digital baseband phase shifted component of the training signal;

analysing, in the digital domain, the digital baseband in-phase and phase shifted components of the training signal so as to detect the IQ-imbalance; and correcting the IQ-imbalance, based on the analysis, in the analogue domain.

According to a second aspect of the invention there is provided a direct conversion receiver comprising:

a training signal generator for generating a radio frequency training signal;

an in-phase branch and a quadrature-phase branch for conveying the received radio frequency signal in the in-phase branch and the quadrature-phase branch;

a first mixer for mixing, in the analogue domain, the radio frequency training signal of the in-phase branch with a first mixing signal to form a baseband in-phase component of the training signal and second mixer for mixing, in the analogue domain, the radio frequency training signal of the quadrature-phase branch with a second mixing signal to form a phase shifted component of the training signal;

means for analogue-to-digital converting the baseband in-phase component of the training signal and the baseband phase shifted component of the training signal to form a digital baseband in-phase component of the training signal and a digital baseband phase shifted component of the training signal;

a digital demodulator for analysing, in the digital domain, the digital baseband in-phase and phase shifted components of the training signal so as to detect an IQ-imbalance, the direct conversion receiver being adapted to correct the IQ-imbalance, based on the analysis, in the analogue domain.

According to a third aspect of the invention there is provided a communication device comprising a direct conversion receiver for correcting an IQ-imbalance, the direct conversion receiver comprising:

a training signal generator for generating a radio frequency training signal;

an in-phase branch and a quadrature-phase branch for conveying the received radio frequency signal in the in-phase branch and the quadrature-phase branch;

a first mixer for mixing, in the analogue domain, the radio frequency training signal of the in-phase branch with a first mixing signal to form a baseband in-phase component of the training signal and second mixer for mixing, in the analogue domain, the radio frequency training signal of the quadrature-phase branch with a second mixing signal to form a phase shifted component of the training signal;

means for analogue-to-digital converting the baseband in-phase component of the training signal and the baseband phase shifted component of the training signal to form a digital baseband in-phase component of the training signal and a digital baseband phase shifted component of the training signal;

a digital demodulator for analysing, in the digital domain, the digital baseband in-phase and phase shifted components of the training signal so as to detect an IQ-imbalance, the direct conversion receiver being adapted to correct the IQ-imbalance, based on the analysis, in the analogue domain.

According to a fourth aspect of the invention there is provided a system comprising a transmitter and a direct conversion receiver for correcting an IQ-imbalance, the transmitter comprising a modulator for transmitting a radio frequency signal to the direct conversion receiver the direct conversion receiver comprising:

a training signal generator for generating a radio frequency training signal;

an in-phase branch and a quadrature-phase branch for conveying the received radio frequency signal in the in-phase branch and the quadrature-phase branch;

a first mixer for mixing, in the analogue domain, the radio frequency training signal of the in-phase branch with a first mixing signal to form a baseband in-phase component of the training signal and second mixer for mixing, in the analogue domain, the radio frequency training signal of the quadrature-phase branch with a second mixing signal to form a phase shifted component of the training signal;

means for analogue-to-digital converting the baseband in-phase component of the training signal and the baseband phase shifted component of the training signal to form a digital baseband in-phase component of the training signal and a digital baseband phase shifted component of the training signal;

a digital demodulator for analysing, in the digital domain, the digital baseband in-phase and phase shifted components of the training signal so as to detect an IQ-imbalance, the direct conversion receiver being adapted to correct the IQ-imbalance, based on the analysis, in the analogue domain.

According to a fifth aspect of the invention there is provided a method of adjusting IQ-imbalance between I and Q branches in a receiver, the method comprising:

locally generating a radio frequency training signal;
inserting the radio frequency training signal into the I and Q branches;
producing an in-phase training signal and a phase-shifted training signal in the respective I and Q branches;
analysing the in-phase training signal and the phase-shifted training signal to produce a control signal;
using the control signal to correct IQ-imbalance between the in-phase training signal and the phase-shifted training signal.

BRIEF DESCRIPTION OF THE DRAWINGS

Embodiments of the invention will now be described by way of example with reference to the accompanying drawings in which.

DETAILED DESCRIPTION

Figure 1:
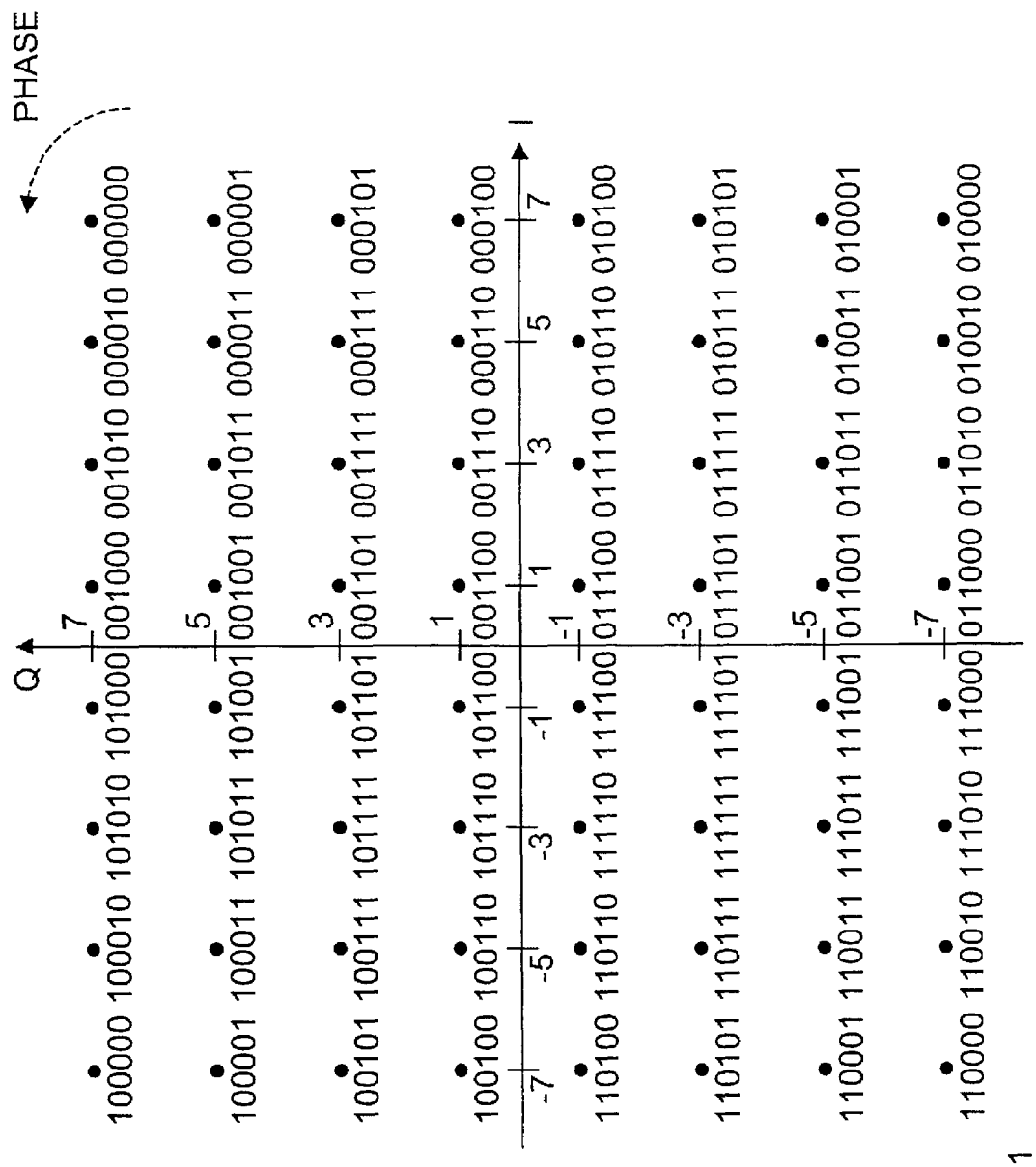
FIG. 1 shows a constellation diagram showing 64-QAM constellation points.

FIG. 1 has already been described in the foregoing.

In the following, a DVB-T system, according to a preferred embodiment, will be described. The system comprises a DVB-T transmitter and a DVB-T receiver. The DVB-T transmitter functions in a manner known to a person skilled in the art. It comprises a COFDM modulator for modulating digital data to be broadcast to the DVB-T receiver.

The DVB-T (broadband) receiver according to a preferred embodiment of the invention is located in a mobile communication device so as to form a portable wireless handheld device suitable for DVB-T operation. In addition to the DVB-T receiving capability the mobile communication device may have a cellular network capability in order to perform interactive communication with a cellular network such as a cellular telephone network. The device may be referred to as a media terminal or a media screen.

The DVB-T receiver of the preferred embodiment functions generally according to a well known direct conversion principle, but in addition to normal DVB-T signal reception the DVB-T receiver is adapted to adjust its IQ-imbalance with the aid of a locally generated training signal. During the normal DVB-T signal reception a DVB-T signal is received and processed at the DVB-T receiver whereas during the IQ-adjustment the DVB-signal is not processed in the DVB-T receiver but an IQ-adjustment, based on the locally generated training signal, is performed. The DVB-T receiver has thus in addition to a first mode of operation which may be called a normal DVB-T reception mode a second mode of operation which may be called an IQ-imbalance adjustment mode. The IQ-adjustment is performed in order to improve the quality of the normal DVB-T reception.

Figure 2:
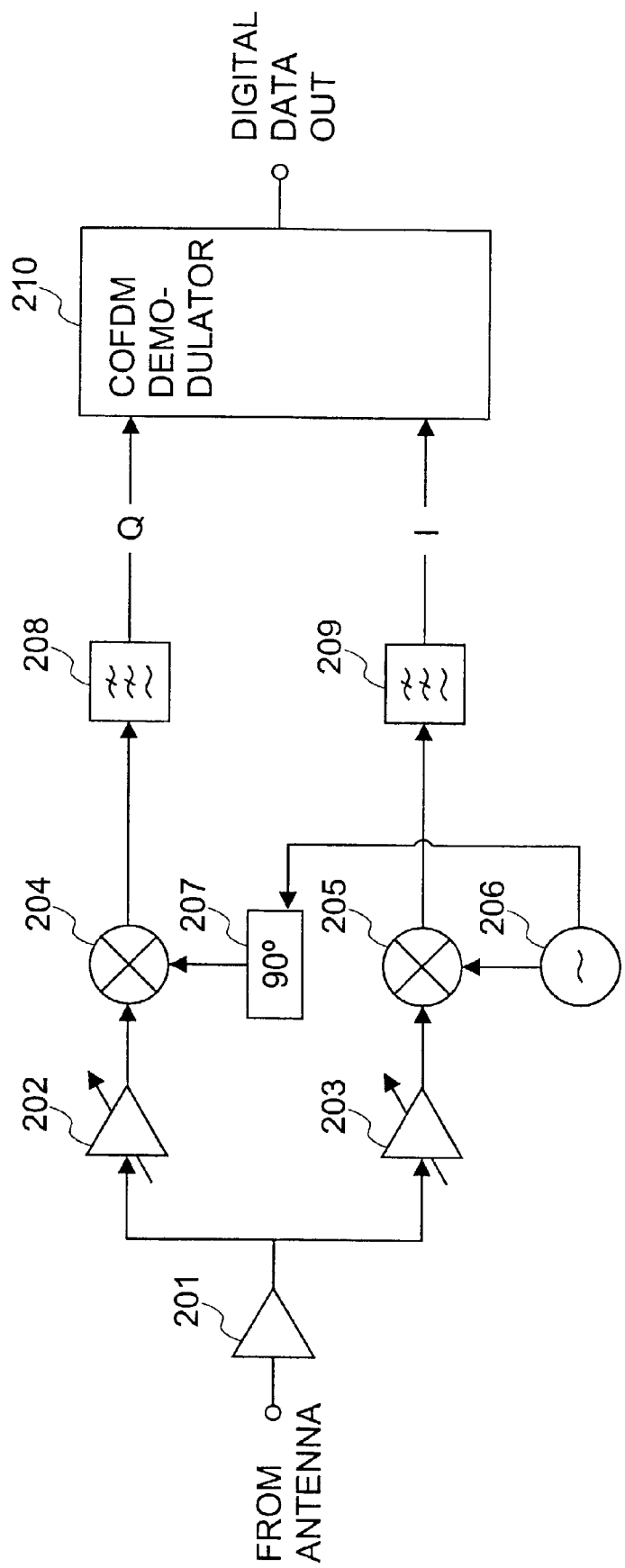
FIG. 2 shows the functional blocks of a DVB-T receiver used in a first mode of operation.

In the following, the two modes of operation of the DVB-T receiver are described in more detail. The normal DVB-T reception mode is described first. Reference is made to FIG. 2 which shows the basic functional blocks of a DVB-T receiver 200, the functional blocks shown relating especially to the normal DVB-T reception mode of the DVB-T receiver 200.

In the normal DVB-T reception mode, digital data which has been COFDM modulated into an analogue broadband radio frequency DVB-T signal and which has been transmitted from a DVB-T transmitter and received via an antenna (not shown) of the DVB-T receiver 200 is conveyed to a low noise amplifier 201 of the DVB-T receiver 200. In the low noise amplifier 201 the DVB-T signal is amplified in order to raise the power level of the received DVB-T signal.

The amplified DVB-T signal is split into two substantially identical signals one of which is conveyed to a first adjustable amplifier 202 and the other of which is conveyed to a second adjustable amplifier 203. The signal branch along which the first adjustable amplifier 202 resides is called a Q-branch and the signal branch along which the second adjustable amplifier 203 resides is called an I-branch.

The first adjustable amplifier 202 amplifies the signal travelling along the Q-branch and the second adjustable amplifier 203 amplifies the signal travelling along the I-branch. In the Q-branch the amplified signal is conveyed to a first input of a first down conversion mixer 204 and in the I-branch the amplified signal is conveyed to a first input of a second down conversion mixer 205.

A local oscillator 206 generates a local oscillator signal. The local oscillator signal is conveyed to a second input of the second down conversion mixer 205. Additionally, the local oscillator signal is conveyed to an adjustable phase shifter 207 which shifts the phase of the local oscillator signal by 90 degrees. The phase shifted local oscillator signal is conveyed to a second input of the first down conversion mixer 204.

The first down conversion mixer 204 mixes the Q-branch signal coming from the first adjustable amplifier 202 with the phase shifted local oscillator signal in order to generate a baseband Q-signal component. The baseband Q-signal component is conveyed to a first low pass filter 208 which low pass filters the baseband Q-signal component of the DVB-T signal. The first low pass filter 208 is a low pass filter of a fixed pass band the width of which is substantially the same as the width of one DVB-T channel divided by two. The pass band of the first low pass filter 208 has steep edges so as to strongly attenuate the frequency components that lie outside the pass band. From the first low pass filter 208 the Q-signal component is conveyed to a COFDM demodulator 210 for digital demodulation.

The second down conversion mixer 205 mixes the I-branch signal coming from the second adjustable amplifier 203 with the local oscillator signal in order to generate a baseband I-signal component. The baseband I-signal component is conveyed to a second low pass filter 209 which low pass filters the baseband I-signal component of the DVB-T signal. The second low pass filter 209 is a low pass filter of a fixed pass band the width of which is substantially the same as the width of one DVB-T channel divided by two. The pass band of the second low pass filter 209 has steep edges so as to strongly attenuate the frequency components that lie outside the pass band. From the second low pass filter 209 the I-signal component is conveyed to the COFDM demodulator 210 for digital demodulation.

To take a numerical example relating to the frequencies of the different signals, if, for example, the centre frequency of the DVB-T receiving channel is 602 MHz the frequency of the local oscillator signal is also 602 MHz. If the bandwidth of the DVB-T receiving channel is 8 MHz the frequency band of the baseband I- and Q-signal components, after the mixing and low pass filtering, ideally reaches from 0 MHz to 4 MHz.

The COFDM demodulator 210 is a digital demodulator block which demodulates the received COFDM modulated DVB-T signal so as to regenerate the originally transmitted digital data. From the COFDM demodulator 210 the digital data may be conveyed, for example, to an MPEG-2 decoder, to an IP (Internet Protocol) stack or to another appropriate functional block for further processing.

Figure 3:
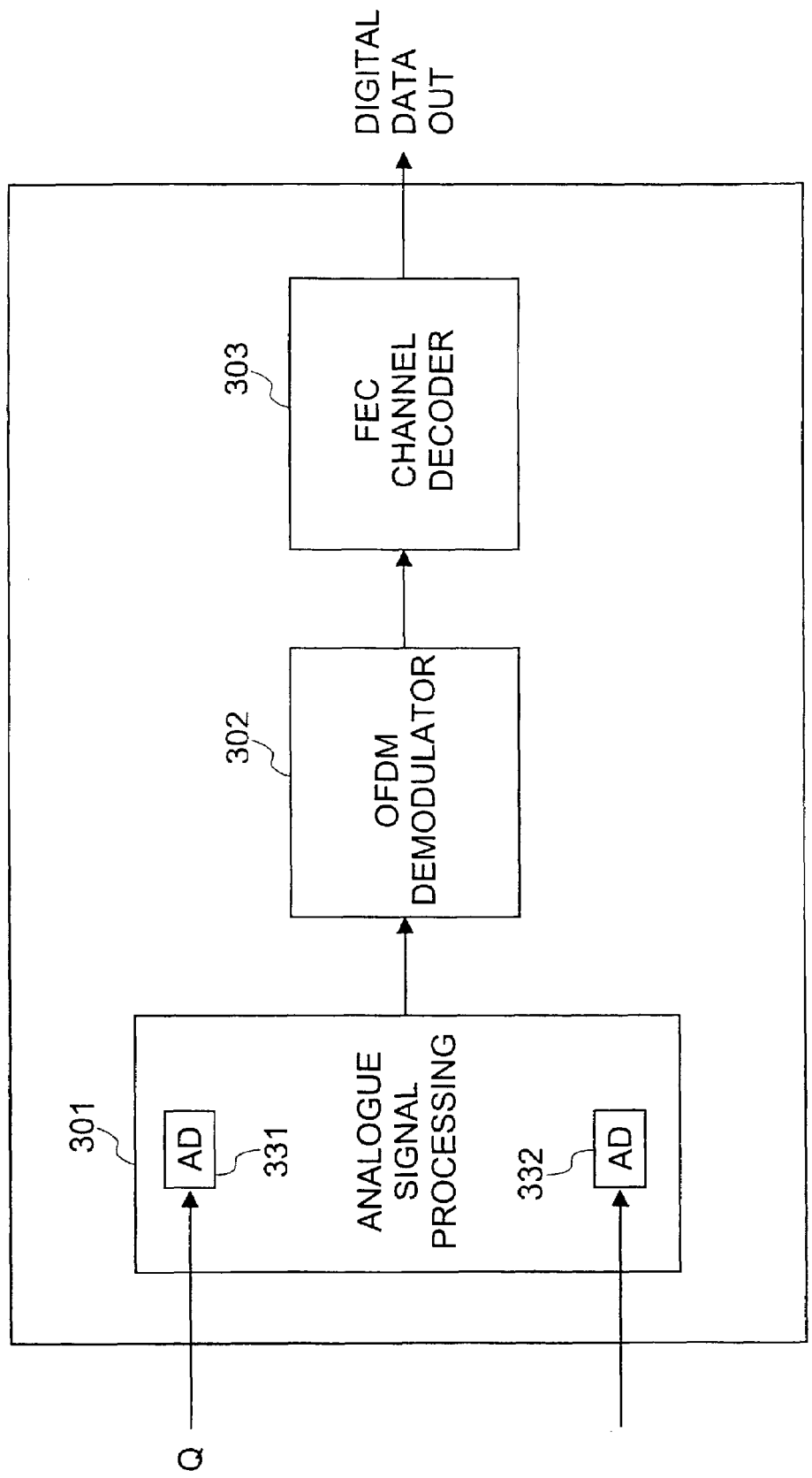
FIG. 3 shows detail of the DVB-T receiver of FIG. 2.

FIG. 3 shows basic blocks of the COFDM demodulator 210. These are an analogue signal processing block 301, an OFDM (Orthogonal Frequency Division Multiplex) demodulator block 302 and a FEC (Forward Error Correction) channel decoder 303.

A first analogue-to-digital converter 331 of the analogue signal processing block 301 converts the Q-signal component from analogue form to digital form. A second analogue-to-digital converter 332 of the analogue signal processing block 301 converts the I-signal component from analogue form to digital form. The digital I- and Q-signal components are conveyed to the OFDM demodulator block 302 which performs resampling and Fast Fourier Transform (FFT) operations on the I- and Q-signal components in order to generate a frequency domain DVB-T signal. Furthermore, the OFDM demodulation block 302 determines, based on particular pilot signals, a transfer function H(f) of the DVB-T (receiving) channel in use, and based on the transfer function H(f), corrects the effects that the transmission path causes to the DVB-T signal.

Finally, the OFDM demodulator block 302 generates, based on the corrected DVB-T signal, so called soft decisions about the bits transmitted, that is it generates probabilities about the transmitted bits.

The soft decisions are conveyed to the FEC channel decoder 303 which performs a two-phase error correction. In the first phase a Viterbi decoder of the FEC channel decoder 303 derives based on the soft decisions, using redundancy inserted by a convolutional encoder of the DVB-T transmitter, the convolutional encoder input bit stream which most probably has been transmitted from the DVB-T transmitter. The derived bit stream is conveyed to a Reed-Solomon decoder of the FEC channel decoder 303. The Reed-Solomon decoder performs the second phase of the error correction, that is the frame decoding. Thereafter descrambling operations are performed in order to regenerate the originally transmitted digital data.

It is apparent to a person skilled in the art that the blocks 301–303 may comprise sub-blocks other than shown in the FIG. 3 and what those sub-blocks may be. Block 301, for example, may contain an automatic gain control (AGC) for the received DVB-T signal. The AGC block may control with one or more AGC feedback control signals the gain of the first and second adjustable amplifiers 202 and 203 so as to optimise the received DVB-T signal voltage level for the analogue-to-digital conversion of the I- and Q-signal components. Block 303, for example, may contain additional blocks for performing deinterleaving operations.

In one implementation of the DVB-T receiver 200 the blocks 201 to 205 and 207 to 209 are implemented in one integrated circuit (IC) which may be called a direct conversion IC (or a radio frequency IC), the local oscillator 206 is implemented as a separate circuit component and the COFDM demodulator 210 is implemented in another integrated circuit which may be called a demodulator IC. The demodulator IC may have a digital signal processor (DSP) for signal processing.

In another implementation the local oscillator 206 is integrated in the direct conversion IC.

Figure 4:
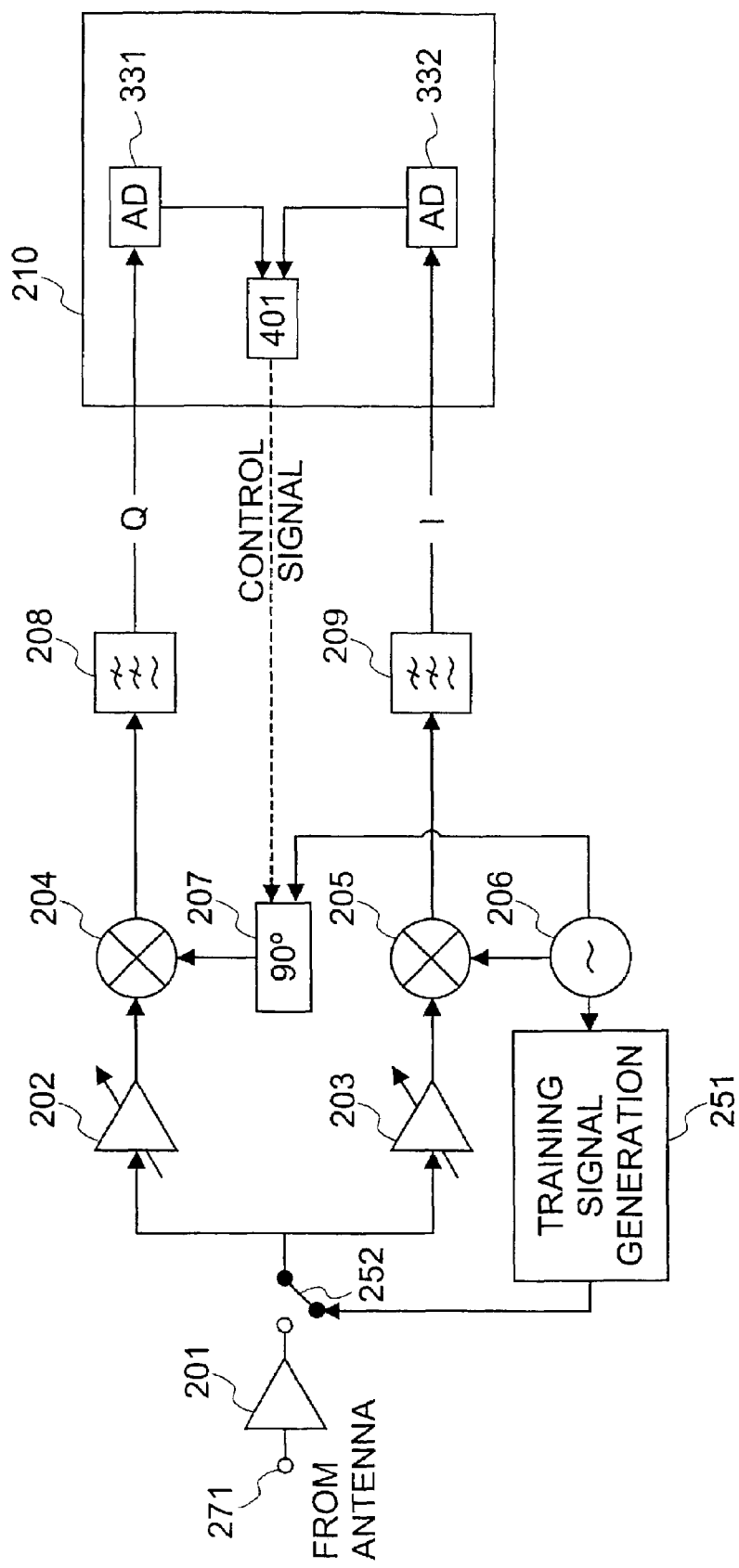
FIG. 4 shows the functional blocks of the DVB-T receiver of FIG. 2 in a second mode of operation.

In the following, the second mode of operation, that is the IQ-imbalance adjustment mode, is described. Reference is made to FIG. 4 which shows the basic functional blocks of the DVB-T receiver 200 (the same DVB-T receiver as shown in FIG. 2), the functional blocks shown relating especially to the IQ-imbalance adjustment mode of the DVB-T receiver 200. Accordingly, FIG. 4 shows additional functional blocks which are used to carry out IQ-imbalance adjustment. These blocks were not shown in FIG. 2 to simplify the description of that figure. However, it should be noted that the additional functional blocks are also present in the embodiment of FIG. 2.

The foregoing implementation of the DVB-T receiver 200 in which the blocks 201 to 205 and 207 to 209 are implemented in a direct conversion IC, the block 206 is implemented as a separate circuit component and the COFDM demodulator 210 is implemented in a demodulator IC is also referred to.

It is to be noted that the DVB-T receiver 200 of FIG. 4 has a training signal generator 251 and a switch 252. In the normal DVB-T reception illusrated in FIG. 2 the switch 252 is in a state wherein it lets the DVB-T signal be processed in the direct conversion IC but blocks out a training signal from the direct conversion IC.

The DVB-T transmitter inserts a guard interval in the DVB-T signal before each OFDM symbol to be transmitted. The guard interval is a cyclic continuation of a previously transmitted OFDM symbol. The guard interval is used to prevent inter symbol interference caused by multipath propagation of the DVB-T signal. In a signal acquisition phase, which is a particular setup phase of the DVB-T receiver, the guard interval is additionally used in achieving syncronisation. When the syncronisation is achieved it is not mandatory that the DVB-T signal is received at the DVB-T receiver 200 all the time during every guard interval. In other words, it is not mandatory that the DVB-T signal is connected to the COFDM demodulator 210 via the direct conversion IC all the time during every guard interval.

In the IQ-imbalance adjustment mode a training signal is generated in a training signal generator 251. The training signal is, in this embodiment, a signal derived from the local oscillator signal. It is adjusted so that when it is converted to baseband it is in a frequency range which is suitable for processing by the DVB-T receiver.

The training signal is injected during the guard interval into the input 271 of the direct conversion IC or to a suitable place after the input. FIG. 4 shows an implementation in which the training signal is injected into the direct conversion IC through a switch 252 located between the low noise amplifier 201 and the adjustable amplifiers 202 and 203. The DVB-T signal received via the antenna of the DVB-T receiver is blocked out from the direct conversion IC so that it does not interfere with the IQ-imbalance adjustment. In the implementation shown in FIG. 4 it is the switch 252 that blocks out the DVB-T signal. The switch 252 may be controlled directly by the COFDM demodulator 210 which knows the instants of time at which the guard interval begins and ends. Alternatively, a separate processor may control the switch 252.

In the direct conversion IC, the training signal is processed in a similar manner to processing of the DVB-T signal during normal DVB-T signal reception. Accordingly, the training signal is split into two substantially identical signals one of which is conveyed to the I-branch and the other of which is conveyed to the Q-branch of the DVB-T receiver 200.

The first adjustable amplifier 202 amplifies the signal travelling along the Q-branch and the second adjustable amplifier 203 amplifies the signal travelling along the I-branch. In the Q-branch the amplified signal is conveyed to the first input of the first down conversion mixer 204 and in the I-branch the amplified signal is conveyed to the first input of the second down conversion mixer 205.

The local oscillator signal is conveyed to the second input of the second down conversion mixer 205 and the phase shifted local oscillator signal is conveyed to the second input of the first down conversion mixer 204. The phase shifting of the local oscillator signal is performed in the adjustable phase shifter 207.

The first down conversion mixer 204 mixes the Q-branch signal coming from the first adjustable amplifier 202 with the phase shifted local oscillator signal in order to generate a baseband Q-signal component of the training signal, that is a phase shifted component of the training signal. The baseband Q-signal component is conveyed to the first low pass filter 208 which low pass filters the baseband Q-signal component. From the first low pass filter 208 the Q-signal component is conveyed to the COFDM demodulator 210.

The second down conversion mixer 205 mixes the I-branch signal coming from the second adjustable amplifier 203 with the local oscillator signal in order to generate a baseband I-signal component of the training signal. The baseband I-signal component is conveyed to the second low pass filter 209 which low pass filters the baseband I-signal component. From the second low pass filter 209 the I-signal component is conveyed to the COFDM demodulator 210.

In the IQ-imbalance adjustment mode the COFDM demodulator 210 adjusts the IQ-imbalance by controlling the adjustable phase shifter 207 which generates the phase difference for the signals travelling along the I- and Q-branches. The adjustment is needed because the adjustable phase shifter is typically frequency-dependent and is thus not able to perform a stable 90 degrees phase difference for the I- and Q-branches throughout the width of the usable frequency band.

The adjustment of the adjustable phase shifter 207 comprises analysing, in the COFDM demodulator, the training signal coming from the direct conversion IC so as to find out whether the phase difference between the I-signal component and the Q-signal component of the training signal is 90 degrees as it should be if the DVB-T receiver 200 is functioning ideally in the frequency band of whichever DVB-T channel is being used. For the analysis the Q-signal component is converted from analogue form to digital form in the first analogue-to-digital converter 331 of the analogue signal processing block 301 of the COFDM demodulator 210 and the I-signal component is converted from analogue form to digital form in the second analogue-to-digital converter 332 of the analogue signal processing block 301 of the COFDM demodulator 210. The digital I- and Q-signal components are conveyed to an IQ-imbalance analysis and control signal generation block 401 of the COFDM demodulator 210 in which the actual IQ-imbalance analysis is performed by carrying out a digital algorithm on the digital I- and Q-signal components. More details on the IQ-imbalance analysis are presented at a later stage in the description when the frequency and the form of the training signal are discussed.

If it is found in the analysis that the phase difference between the I-signal component and the Q-signal component is not 90 degrees, indicating that there is IQ-imbalance, the adjustable phase shifter 207 is adjusted accordingly so that the phase difference is equal to, or tends closer towards 90 degrees. For the adjustment purpose a control signal (also referred to as a correction signal) is generated in the IQ-imbalance analysis and control signal generation block 401. The control signal is conveyed to the adjustable phase shifter 207 the phase shift of which is adjusted with the aid of the control signal. The control signal may be, for example, a DC (Direct Current) voltage level. A particular centre voltage level may correspond to a situation in which the phase shift of the adjustable phase shifter 207 does not have to be corrected. A voltage level lower than the centre voltage level may shift the phase shift of the adjustable phase shifter 207 in one direction and a voltage level higher than the centre voltage level may shift the phase shift of the adjustable phase shifter 207 in an opposite direction.

The IQ-imbalance adjustment is performed iteratively until the phase difference of the I-signal component and the Q-signal component of the training signal is 90 degrees, that is the IQ-imbalance is corrected. The IQ-imbalance adjustment is ended when the 90 degrees phase difference has been reached, subsequently the normal DVB-T reception mode is resumed. A new IQ-imbalance adjustment is performed during each of the the subsequent guard intervals. Alternatively, a new IQ-imbalance adjustment is performed during only some (but not all) subsequent predetermined guard intervals.

The IQ-imbalance adjustment may occur iteratively during the whole guard interval the length of which depends on particular transmission parametres. Typically, the length of the guard interval is between 7 μs and 224 μs. A common value is 112 μs.

When, for example, a 64-QAM constellation is used an IQ-imbalance of 5 degrees may be enough to impair the operation of the DVB-T receiver 200. When the IQ-imbalance is adjusted, according to the preferred embodiment, it is possible to improve the quality of the DVB-T reception so that the constellation points, that is the transmitted bit stream, can be correctly detected at the DVB-T receiver 200.

Figure 5:
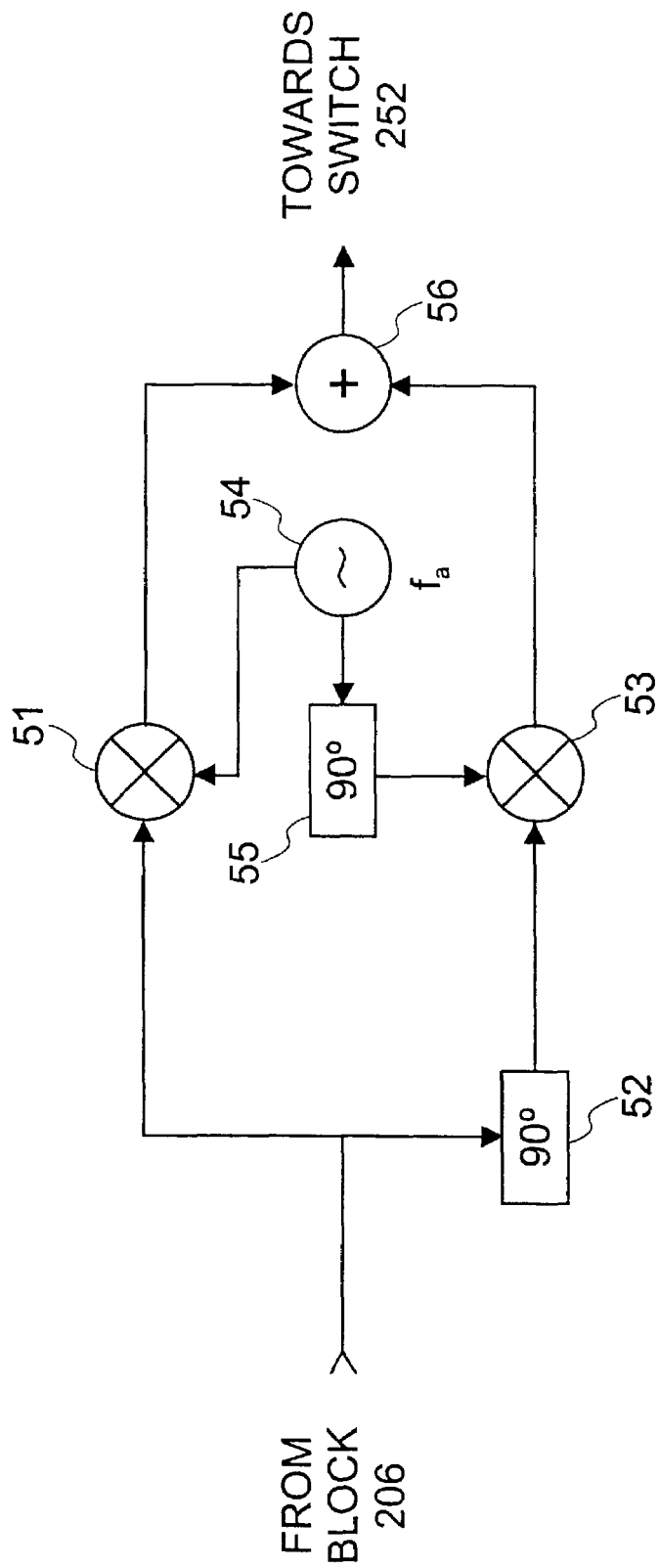
FIG. 5 shows a training signal generator according to an embodiment of the invention.

In the following, an implementation of the training signal generator 251 is presented after which a numerical example relating to the IQ-imbalance adjustment is presented. In the implementation shown in FIG. 5 the training signal generator 251 is a well known image reject mixer. The image reject mixer 251 is implemented as a separate circuit component. In another implementation the image reject mixer 251 is integrated in the direct conversion IC. The input signal of the image reject mixer is the local oscillator signal provided by the local oscillator 206. The input signal is split into two identical signals one of which is conveyed to a first input of a first mixer 51 and the other of which is conveyed via a first phase shifter 52, which shifts the phase of the input signal by 90 degrees, to a first input of a second mixer 53.

A second oscillator 54 generates a second oscillator signal. In practice, the second oscillator signal may be generated from a phase locked loop reference oscillator with a digital divider. The second oscillator signal is conveyed to a second input of the first mixer 51. Additionally, the second oscillator signal is conveyed to a second phase shifter 55 which shifts the phase of the second oscillator signal by 90 degrees. The phase shifted second oscillator signal is conveyed to a second input of the second mixer 53.

The first mixer 51 mixes the local oscillator signal with the second oscillator signal. The mixed signal is conveyed to a first input of an adder 56. The second mixer 53 mixes the phase shifted local oscillator signal with the phase shifted second oscillator signal. The mixed signal is conveyed to a second input of the adder 56. The mixed signals coming from the first and the second mixers 51 and 53 are summed in the adder 56 to produce an output signal of the image reject mixer 251 the output signal being conveyed to the direct conversion IC via the switch 252.

The output signal of the image reject mixer 251, that is the training signal, is a sinusoidal signal. The output frequency $f_{out}$ of the image reject mixer 251, that is the frequency of the training signal, is:

$$f_{out} = f_{local} + f_a$$

wherein $f_{local}$ indicates the frequency of the local oscillator 206, that is the input frequency to the image reject mixer 251, and $f_a$ indicates the frequency of the second oscillator 54. The sinusoidal training signal is thus of the form $\cos(2\pi(f_{local}+f_a)t)$ wherein t indicates time.

If, for example, the frequency $f_{local}$ of the local oscillator is 602 MHz, that is it is desired to perform IQ-imbalance adjustment for a DVB-T channel the centre frequency of which is 602 MHz, and the frequency $f_a$ of the second oscillator 54 is 2 MHz the training signal has a frequency of 604 MHz(=602 MHz+2 MHz). When the training signal of 604 MHz is injected into the direct conversion IC and mixed with the phase shifted local oscillator signal of 602 MHz in the first down conversion mixer 204 and with the local oscillator signal of 602 MHz in the second down conversion mixer 205 baseband I- and Q-signal components of 2 MHz are generated. The baseband I-signal component is of the form $\cos(2\pi f_a t)$ and the baseband Q-signal component is of the form $\cos(2\pi f_a t - \phi)$ wherein $\phi$ indicates the phase of the Q-signal component. If the adjustable phase shifter 207 is operating ideally the phase $\phi$ is $\pi/2$ which corresponds to 90 degrees. According to trigonometry $\cos(2\pi f_a t - \pi/2) = \sin(2\pi f_a t)$. In an ideal situation the baseband I-signal component is thus of the form $\cos(2\pi f_a t)$ and the Q-signal component is of the form $\sin(2\pi f_a t)$.

The IQ-imbalance analysis of the baseband I- and Q-signal components is performed after they have been converted into digital form. As mentioned in the foregoing the IQ-imbalance analysis is performed by carrying out a digital algorithm on the digital I- and Q-signal components. Since $\sin(2\pi f_a t)$ has a value of zero when $\cos(2\pi f_a t)$ has a peak value of 1 or −1, the purpose of carrying out the algorithm, in this embodiment, is to find out whether the digital baseband Q-signal component of the training signal has a peak value when the digital I-signal component of the training signal has a value of zero (or its centre value if there is an offset). If this is not the case the phase difference between the I- and Q-signal components deviates from 90 degrees, the control signal is generated and the adjustable phase shifter 207 is adjusted accordingly. The algorithm is carried out and the control signal is generated in the IQ-imbalance analysis and control signal generation block 401 (FIG. 4) which may be implemented by a digital signal processor (DSP).

The frequency of the baseband I- and Q-signal components equals the frequency $f_a$. Therefore it is appropriate to choose the frequency $f_a$ such that it fits in the frequency band of one baseband DVB-T channel.

The foregoing description describes that the normal DVB-T reception mode and the IQ-imbalance adjustment mode alternate during the use of the DVB-T receiver. In another embodiment the normal DVB-T reception mode and the IQ-imbalance adjustment mode do not alternate as is described in the foregoing but the IQ-imbalance adjustment is only performed during a channel switch or right after a channel switch has been performed, that is in response to a channel switch. The channel switch is typically performed on the user's initiative when he or she wants to switch the DVB-T receiver from receiving one DVB-T channel to receiving another DVB-T channel.

The foregoing description relates to adjusting, that is correcting, the IQ-phase imbalance. In another embodiment of the invention also the IQ-amplitude imbalance is corrected. When the I- and Q-signal components of the training signal are converted into digital form the amplitudes of the I- and Q-signal components should have the same value assuming that the I-branch and the Q-branch are identical, that is the AGC feedback control signals are similar such that the adjustable amplifiers 202 and 203 have the same gain. The digital I- and Q-signal components of the training signal are conveyed to the IQ-imbalance analysis and control signal generation block 401 of the COFDM demodulator 210 in which an IQ-imbalance analysis is performed. If it is detected in the IQ-imbalance analysis that the amplitudes of the I- and Q-signal components deviate from each other (in practice this may be done by comparing the peak values of the I- and Q-signal components), the gain of one of the I- and Q-branches is adjusted accordingly. The IQ-imbalance analysis and control signal generation block 401 detects the IQ-amplitude imbalance, transfers the information to the AGC block which takes the information into account when generating the next AGC feedback control signals.

Figure 6:
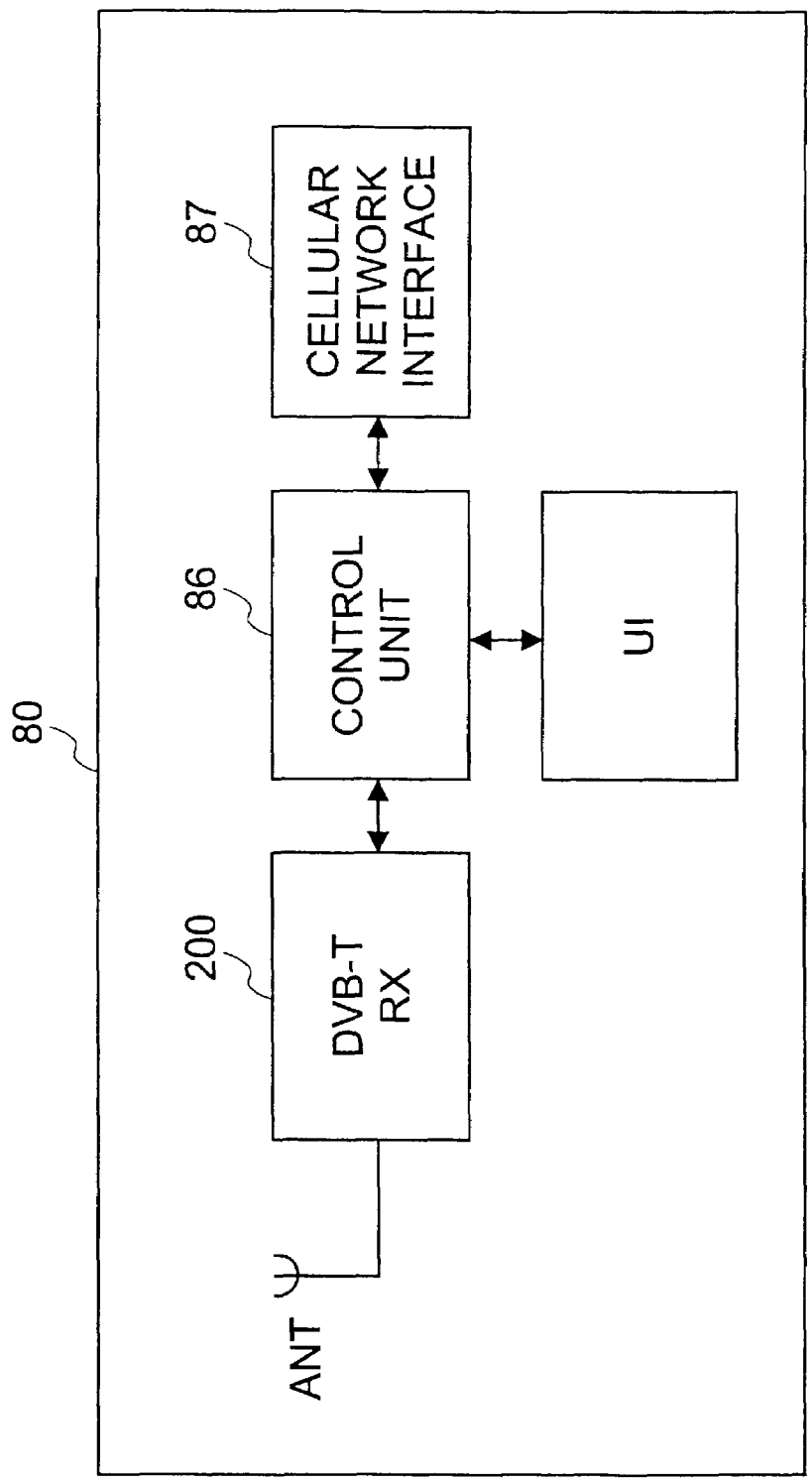
FIG. 6 shows a mobile communication device suitable for implementing the invention.

FIG. 6 shows a mobile communication device 80, referred to as a wireless media terminal, suitable for implementing the invention. The mobile communication device 80 comprises the DVB-T receiver 200 with an internal integrated antenna ANT, a user interface UI and a control unit 86. The DVB-T receiver 200 is coupled to the control unit 86 via a first control/data bus. The user interface UI is coupled to the control unit 86 via a second control/data bus. Additionally, for communication between the mobile communication device 80 and a cellular network (not shown), the mobile communication device may comprise a cellular network interface 87 which is coupled to the control unit 86 via a third control/data bus. The cellular network interface 87 may comprise a radio frequency transceiver (not shown).

The control unit 86 comprises a processor with a memory and software for controlling the operation of the mobile communication device 80. The software contains an MPEG-2 protocol stack for decoding the demodulated digital data which the DVB-T receiver 200 provides for the control unit 86 via the first control/data bus. The user interface UI comprises a display and a keyboard for enabling the user to use the mobile communication device 80. The control unit 86 controls the presentation of information on the user interface UI, for example the presentation of the decoded MPEG-2 digital data (video stream) on the display. The demodulated digital data may contain IP (Internet Protocol) packets of an IP datacast or multicast service. The software of the control unit 86 may contain an IP protocol stack to handle the IP packets.

The present invention enables IQ-imbalance adjustment in a direct conversion receiver. The IQ-phase imbalance is completely corrected or at least reduced in the analogue domain of the receiver with the aid of a control signal generated in the digital domain, that is in the digital demodulator (COFDM demodulator 210) after the analogue-to-digital conversion. According to one embodiment of the invention the IQ-amplitude imbalance is corrected. By reducing the IQ-imbalance signal acquisition may be performed more easily. When the IQ-imbalance is adjusted according to the invention the probability that the constellation points of the complicated phase and amplitude sensitive QAM modulation are detected correctly in the direct conversion receiver may thus be improved. This means that also the transmitted digital data may be more accurately regenerated in the direct conversion receiver.

It has been described that the training signal generator 251 is located in the DVB-T receiver 200. Alternatively the training signal generator 251 may be located outside the DVB-T receiver 200, for example, in another part of the same communication device in which the DVB-T receiver 200 is located. In either case the training signal can be understood to be locally generated. The training signal generator 251 located outside the DVB-T receiver 200 is coupled to the DVB-T received and controlled by the DVB-T receiver 200.

Although the DVB-T system has been used as an example the invention is applicable also in other OFDM multicarrier modulation based systems. The invention is also applicable with appropriate changes in other wideband/broadband systems in which a guard interval or the like is used. The embodiment in which the IQ-adjustment is performed in response to a channel switch is also applicable in direct conversion receivers of narrowband systems which use IQ-modulation.

The invention is not restricted to mobile devices but it may also be used in a fixed DVB-T receiver. This may be present in a so-called set top box.

Particular implementations and embodiments of the invention have been described. It is clear to a person skilled in the art that the invention is not restricted to details of the embodiments presented above, but that it can be implemented in other embodiments using equivalent means without deviating from the characteristics of the invention. The scope of the invention is only restricted by the attached patent claims.

The invention claimed is:

1. A method comprising:
    locally generating a radio frequency training signal, wherein said training signal is generated by a training signal generator, and wherein a local oscillator signal is an input to said training signal generator;
    conveying in the analogue domain the radio frequency training signal to an in-phase branch of a direct conversion receiver and to a quadrature-phase branch of the direct conversion receiver;
    mixing, in the analogue domain, the radio frequency training signal of the in-phase branch with a first mixing signal to form a baseband in-phase component of the training signal and mixing, in the analogue domain, the radio frequency training signal of the quadrature-phase branch with a second mixing signal to form a phase shifted component of the training signal;

analogue-to-digital converting the baseband in-phase component of the training signal and the baseband phase shifted component of the training signal to form a digital baseband in-phase component of the training signal and a digital baseband phase shifted component of the training signal;

analysing in the digital domain, the digital baseband in-phase and phase shifted components of the training signal so as to detect an IQ-imbalance; and correcting the IQ-imbalance, based on the analysis, in the analogue domain, wherein said first mixing signal and said second mixing signal originate from said local oscillator.

2. A method according to claim 1, wherein the method comprises:

analyzing the phase difference between the digital baseband in-phase and phase shifted components of the training signal;

correcting an IQ-phase imbalance of the direct conversion receiver based on the analysis.

3. A method according to claim 1, wherein the method comprises:

analysing whether the phase difference between the digital baseband in phase and phase shifted components of the training signal is 90 degrees;

correcting an IQ phase imbalance of the direct conversion receiver based on the analysis.

4. A method according to claim 3, wherein the analysis of whether the phase difference between the digital baseband in-phase and phase shifted components of the training signal is 90 degrees is performed by analyzing whether the other of the digital baseband components has a peak value when the other of the digital baseband components has zero or center value.

5. A method according to claim 2, wherein a correction of the IQ phase imbalance is made so as to achieve a 90 degrees phase difference between a future baseband in phase component and a future baseband phase shifted component.

6. A method according to claim 1, wherein the radio frequency training signal is a sinusoidal signal.

7. A method according to claim 1, wherein the first mixing signal is a local oscillator signal and the second mixing signal is a phase shifted local oscillator signal.

8. A method according to claim 1, wherein the second mixing signal is phase shifted by substantially 90 degrees with respect to the first mixing signal.

9. A method according to claim 1, wherein the second mixing signal is generated from the first mixing signal by shifting a phase of the first mixing signal in an adjustable phase shifter.

10. A method according to claim 9, wherein the method comprises:

generating, based on the detected IQ-imbalance, a control signal; and correcting the phase shift of the adjustable phase shifter with the aid of the control signal so as to correct the IQ-phase imbalance of the direct conversion receiver.

11. A method according to claim 1, wherein the direct conversion receiver is a broadband receiver located in a mobile communication device so as to form a portable band held device.

12. A method according to claim 1, wherein the direct conversion receiver is selected from a group consisting of a DVB T (Digital Video Broadcasting Terrestrial) direct conversion receiver and an ISDB T (Integrated Services Digital Broadcasting Terrestrial) direct conversion receiver.

13. A method according to claim 1, wherein an IQ amplitude imbalance is corrected based on the analysis of the digital baseband in phase and phase shifted components of the training signal.

14. A method according to claim 13, wherein the correction of the IQ amplitude imbalance is performed by adjusting a gain of at least one of the in phase and quadrature phase branches of the direct conversion receiver.

15. A method according to claim 14, wherein the gain of at least one of the in-phase and quadrature-phase branches of the direct conversion receiver is adjusted by an automatic gain control.

16. A method comprising:

locally generating a training signal derived from a signal produced by a single local oscillator;

conveying the training signal to an in-phase branch of a direct conversion receiver and to a quadrature-phase branch of the direct conversion receiver;

mixing the training signal as conveyed to the in-phase branch with the signal produced by the local oscillator;

mixing the training signal as conveyed to the quadrature-phase branch with a signal derived from the local oscilator; and using the training signal to correct an IQ-imbalance.

17. An apparatus comprising:

a local oscillator for generating a first mixing signal and a second mixing signal;

a training signal generator for generating a radio frequency training signal, wherein the training signal generator inputs are comprised of an output signal of the local oscillator;

an in phase branch and a quadrature phase branch for conveying the radio frequency signal in the in phase branch and the quadrature phase branch;

a first mixer for mixing, in an analogue domain, the radio frequency training signal of the in phase branch with the first mixing signal to form a baseband in phase component of the training signal and a second mixer for mixing, in the analogue domain, the radio frequency training signal of the quadrature phase branch with the second mixing signal to form a phase shifted component of the training signal;

an analog to digital converter that converts the baseband in phase component of the training signal and the baseband phase shifted component of the training signal to form a digital baseband in phase component of the training signal and a digital baseband phase shifted component of the training signal;

a digital demodulator for analysing, in a digital domain, the digital baseband in phase and phase shifted components of the training signal so as to detect an IQ imbalance, the direct conversion receiver being adapted to correct the IQ imbalance, based on the analysis, in the analogue domain.

18. The apparatus of claim 17, wherein the training signal generator comprises the local oscillator.

19. The apparatus of claim 17, wherein the direct conversion receiver is configured to:

analyze the phase difference between the digital baseband in-phase and phase shifted components of the training signal; and correct an IQ-phase imbalance of the direct conversion receiver based on the analysis.

20. The apparatus of claim 17, wherein the direct conversion receiver is configured to:
analyze whether the phase difference between the digital baseband in phase and phase shifted components of the training signal is 90 degrees; and
correct an IQ phase imbalance of the direct conversion receiver based on the analysis.

21. The apparatus of claim 20, wherein the analysis of whether the phase difference between the digital baseband in-phase and phase shifted components of the training signal is 90 degrees is performed by analyzing whether the other of the digital baseband components has a peak value when the other of the digital baseband components has zero or center value.

22. The apparatus of claim 17, wherein the first mixing signal is a local oscillator signal and the second mixing signal is a phase shifted local oscillator signal.

23. The apparatus of claim 17, wherein the second mixing signal is generated from the first mixing signal by shifting a phase of the first mixing signal in an adjustable phase shifter.

24. The apparatus of claim 23, wherein the direct conversion received is configured to:
generate, based on the detected IQ-imbalance, a control signal; and
correct the phase shift of the adjustable phase shifter with the aid of the control signal so as to correct the IQ-phase imbalance of the direct conversion receiver.

25. The apparatus of claim 17, wherein the direct conversion receiver is a broadband receiver.

26. The apparatus of claim 17, configured to correct an IQ amplitude imbalance based on the analysis of the digital baseband in phase and phase shifted components of the training signal.

27. The apparatus of claim 26, configured to perform the correction of the IQ amplitude imbalance by adjusting a gain of at least one of the in phase and quadrature phase branches of the direct conversion receiver.

28. The apparatus of claim 17, wherein the training signal generator comprises an image reject mixer.

29. A communication device comprising:
a direct conversion receiver for correcting an IO imbalance the direct conversion receiver comprising:
a local oscillator for generating a first mixing signal and a second mixing signal;
a training signal generator for generating a radio frequency training signal derived only from a signal produced by the local oscillator;
an in phase branch and a quadrature phase branch for conveying the radio frequency signal in the in phase branch and the quadrature phase branch;
first mixer for mixing, in an analogue domain, the radio frequency training signal of the in phase branch with the first mixing signal to form a baseband in phase component of the training signal and a second mixer for mixing, in the analogue domain, the radio frequency training signal of the quadrature phase branch with the second mixing signal to form a phase shifted component of the training signal;
an analog to digital converter that converts the baseband in phase component of the training signal and the baseband phase shifted component of the training signal to form a digital baseband in phase component of the training signal and a digital baseband phase shifted component of the training signal;
a digital demodulator for analysing in a digital domain, the digital baseband in phase and phase shifted components of the training signal so as to detect an IQ imbalance, the direct conversion receiver being adapted to correct the IQ imbalance, based on the analysis, in the analogue domain.

30. A communication device according to claim 29, wherein the communication device comprises in addition to the direct conversion receiver, a cellular network interface for communicating information with a cellular network.

31. The communication device of claim 29, wherein the training signal generator comprises the local oscillator.

32. The communication device of claim 29, configured to:
analyze the phase difference between the digital baseband in-phase and phase shifted components of the training signal; and
correct an IQ-phase imbalance of the direct conversion receiver based on the analysis.

33. The communication device of claim 29, wherein the second mixing signal is generated from the first mixing signal by shifting a phase of the first mixing signal in an adjustable phase shifter.

34. The communication device of claim 33, configured to:
generate, based on the detected IQ-imbalance, a control signal; and
correct the phase shift of the adjustable phase shifter with the aid of the control signal so as to correct the IQ-phase imbalance of the direct conversion receiver.

35. The communication device of claim 29, wherein the direct conversion receiver is a broadband receiver.

36. The communication device of claim 29, wherein the communication device corrects an IQ amplitude imbalance based on the analysis of the digital baseband in phase and phase shifted components of the training signal.

37. The communication device of claim 29, wherein the training signal generator comprises an image reject mixer.

38. A system comprising: a transmitter and a direct conversion receiver for correcting an IQ imbalance, the transmitter comprising a modulator for transmitting a radio frequency signal to the direct conversion receiver, the direct conversion receiver comprising:
a local oscillator for generating a first mixing signal and a second mixing signal;
a training signal generator for generating a radio frequency training signal derived from a signal produced by the local oscillator, wherein the training signal generator takes as an input the output of the local oscillator;
an in phase branch and a quadrature phase branch for conveying the radio frequency signal in the in phase branch and the quadrature phase branch;
a first mixer for mixing, in an analogue domain, the radio frequency training signal of the in phase branch with the first mixing signal to form a baseband in phase component of the training signal and a second mixer for mixing, in the analogue domain, the radio frequency training signal of the quadrature phase branch with the second mixing signal to form a phase shifted component of the training signal;
an analog to digital converter that converts the baseband in phase component of the training signal and the baseband phase shifted component of the training sig nal to form a digital baseband in phase component of the training signal and a digital baseband phase shifted component of the training signal;

a digital demodulator for analysing, in a digital domain, the digital baseband in phase and phase shifted components of the training signal so as to detect an IQ imbalance, the direct conversion receiver being adapted to correct the IQ imbalance, based on the analysis, in the analogue domain.

39. The system of claim 38, wherein the training signal generator comprises the local oscillator.

* * * * *

UNITED STATES PATENT AND TRADEMARK OFFICE
CERTIFICATE OF CORRECTION

| | | |
|---|---|---|
| PATENT NO. | : 7,233,629 B2 | Page 1 of 1 |
| APPLICATION NO. | : 10/184110 | |
| DATED | : June 19, 2007 | |
| INVENTOR(S) | : Tommi Auranen | |

It is certified that error appears in the above-identified patent and that said Letters Patent is hereby corrected as shown below:

In Claim 29, Column 15, Line 41:
  Please delete "IO" and insert -- IQ--

In Claim 29, Column 15, Line 51:
  Please delete "first mixer" and insert -- a first mixer--

Signed and Sealed this

Thirteenth Day of November, 2007

JON W. DUDAS
*Director of the United States Patent and Trademark Office*